(12) United States Patent
Boerstler et al.

(10) Patent No.: US 7,350,095 B2
(45) Date of Patent: Mar. 25, 2008

(54) DIGITAL CIRCUIT TO MEASURE AND/OR CORRECT DUTY CYCLES

(75) Inventors: David William Boerstler, Round Rock, TX (US); Eskinder Hailu, Austin, TX (US); Byron Lee Krauter, Round Rock, TX (US); Kazuhiko Miki, Round Rock, TX (US); Jieming Qi, Austin, TX (US)

(73) Assignees: International Business Machines Corporation, Armonk, NY (US); Toshiba America Electronics Components, Inc., Irvine, CA (US)

( * ) Notice: Subject to any disclaimer, the term of this patent is extended or adjusted under 35 U.S.C. 154(b) by 485 days.

(21) Appl. No.: 11/082,973

(22) Filed: Mar. 17, 2005

(65) Prior Publication Data

US 2006/0212739 A1    Sep. 21, 2006

(51) Int. Cl.
  *G06F 1/00* (2006.01)
  *G06F 1/12* (2006.01)
  *G06F 1/04* (2006.01)
(52) U.S. Cl. .................. 713/500; 713/400; 713/600
(58) Field of Classification Search ............. 713/500
  See application file for complete search history.

(56) References Cited

U.S. PATENT DOCUMENTS

| 5,572,158 | A | 11/1996 | Lee et al. |
| 5,757,218 | A | 5/1998 | Blum |
| 6,084,452 | A | 7/2000 | Drost et al. |
| 6,169,765 | B1 | 1/2001 | Holcombe |
| 6,426,660 | B1 * | 7/2002 | Ho et al. ................. 327/175 |
| 6,469,565 | B1 | 10/2002 | Lee |
| 6,487,246 | B1 | 11/2002 | Hoeld |
| 6,577,202 | B1 | 6/2003 | Atallah et al. |
| 6,583,657 | B1 | 6/2003 | Eckhardt et al. |
| 6,670,838 | B1 | 12/2003 | Cao |
| 6,859,081 | B2 * | 2/2005 | Hong et al. ................ 327/175 |
| 6,960,952 | B2 * | 11/2005 | Nguyen et al. ............ 327/175 |

* cited by examiner

*Primary Examiner*—James K. Trujillo
*Assistant Examiner*—Stefan Stoynov
(74) *Attorney, Agent, or Firm*—Carr LLP; D'Ann N. Rifai

(57) ABSTRACT

A method, an apparatus, and a computer program are provided to measure and/or correct duty cycles. Duty cycles of various signals, specifically clocking signals, are important. However, measurement of very high frequency signals, off-chip, and in a laboratory environment can be very difficult and present numerous problems. To combat problems associated with making off-chip measurements and adjustments of signal duty cycles, comparisons are made between input signals and divided input signals that allow for easy measurement and adjustment of on-chip signals, including clocking signals.

1 Claim, 3 Drawing Sheets

DIGITAL CIRCUIT TO MEASURE AND/OR CORRECT DUTY CYCLES

FIELD OF THE INVENTION

The present invention relates generally to duty cycle measurement and adjustment and, more particularly, to off-chip measurement and adjustment of high frequency signals.

DESCRIPTION OF THE RELATED ART

As the operating frequency of micro-processors has increased, the pulse width of the driving clocks is being reduced to such an extent that dynamic or static duty cycle corrections have become essential to ensure proper operation of logic circuits. In other environments, especially for slower operating frequencies, intentional duty cycle distortion is introduced to limit the 'high state' of a driving clock to prevent discharging of critical nodes. This, for example, is achieved by passing the driving clock through a pulse width limiter. In many present environments, this maximum pulse width is limited to a few hundred pico seconds.

For test purposes, it is very challenging to directly monitor multi-GHz signals and their associated duty cycle information. This is due to the bandwidth limitations of test equipments and their associated accessories, such as cables. A standard approach to test high frequency signals involves dividing them into lower frequency signals, which can then be easily characterized in a test setup.

However, frequency dividing of signals for monitoring, especially high frequency signals, can result in the loss of duty cycle information. Therefore, there is a need to monitor high frequency signals without substantial loss of duty cycle information in such a manner that addresses at least some of the concerns of conventional frequency monitoring.

SUMMARY OF THE INVENTION

The present invention provides a method, an apparatus, and a computer program product for measuring and correcting duty cycle information of a clock input signal source. A plurality of Low Pass Filters (LPFs) is employed. These LPFs output signals that are proportional to the duty cycles of input signals, where one signal is from the clock input signal source. A correction circuit is also employed that also receives a signal from the clock input signal source, and the correction circuit outputs a corrected clocking signal to one LPF of the plurality of LPFs. Based on the outputs of the LPFs, a comparator compares outputs of the LPFs to output a feedback signal to the correction circuit.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

Figure 1:
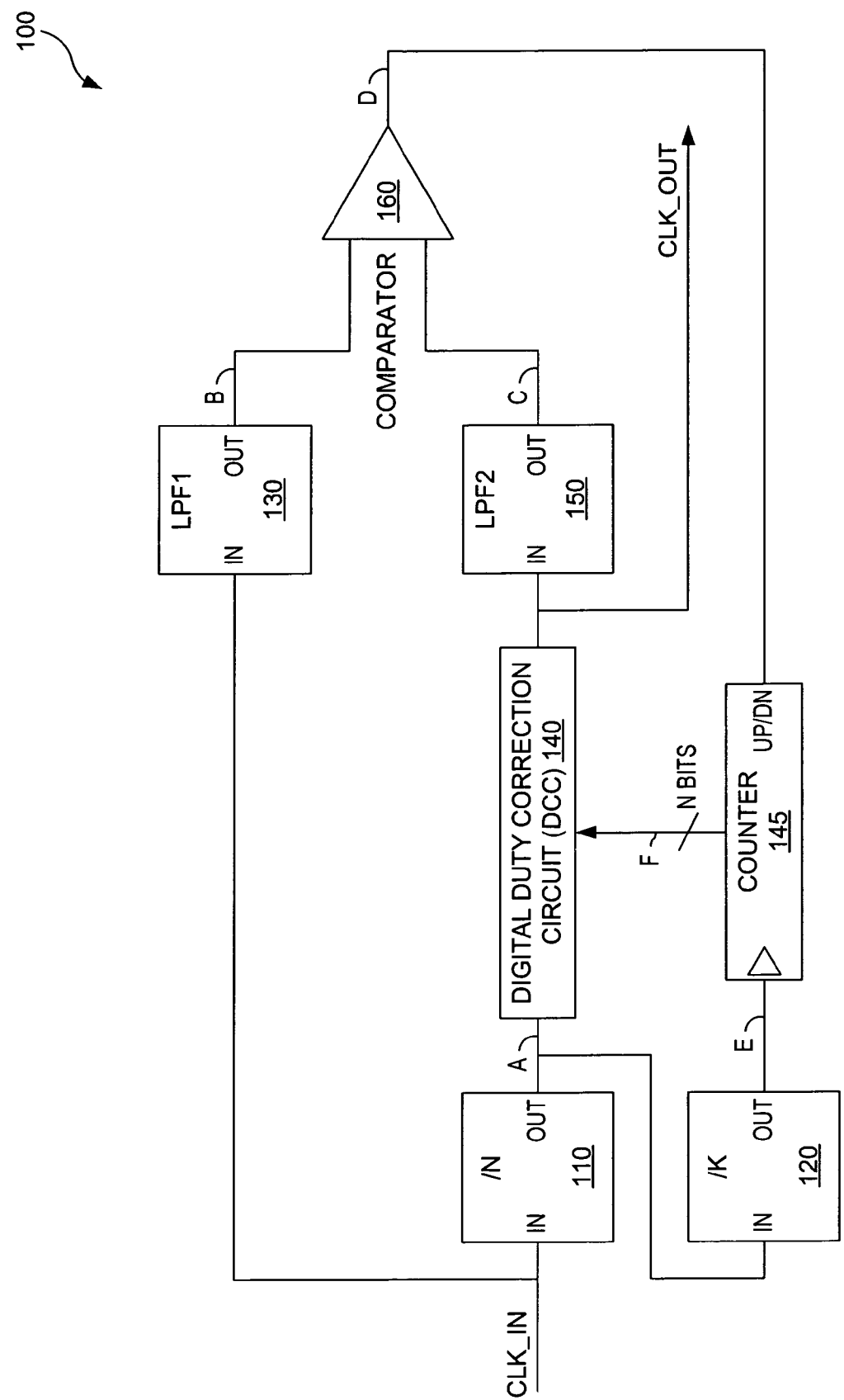
FIG. 1 illustrates a circuit for monitoring high frequency circuits that allows for the regeneration of duty-cycle information.

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Generally, the circuit 100 can restore duty cycle information in a divided signal. This signal can, for example, be used during manufacturing testing to measure the duty cycle of an undivided signal. In one embodiment, the circuit is wholly digital or firmware, making it suitable for applications in advanced digital CMOS technology. Furthermore, unlike analog based implementations, this approach is robust against process-induced mismatches. In other words, there are many more process variation tolerances than a fully analog approach. Finally, with very little modification, this circuit can be used both to extract duty cycle information as well as to correct duty cycles.

The circuit 100 has a input high frequency CLK_IN. A first divider, divide-by-N (/N) 110 is coupled to the CLK_IN signal. A second divider, a divide-by-K 120 (/K) is coupled to the output of divider 110. A reset for the n-bit counter 145 is coupled to the output of the divider 120 that can count from 1 to $2^n$. A first low pass filter 130 (LPF1) is coupled to the CLK_IN pulse. A digital duty cycle correction circuit (Digital DCC) 140 is coupled to the output of divider 110 and the counter 145. The output of the DCC 140 is coupled to a LPF 2 150. The output of the DCC 140 also becomes the CLK_OUT signal. The output of the LPF 1 130 and LPF 2 150 are coupled to the comparative inputs of a comparator 160. The output of the comparator 160 is coupled to the UP/DOWN counter, as a function of the output of the comparator.

The n bit counter 145 is controlled both by the divide-by-K (/K) divider 120 and the output of the comparator 160. The counter 145 increments/decrements its values on a specified edge of the output of the divide-by-K (/K) divider 120. When there exists no trigger signal from the divider 120, the counter 145 maintains its last value. Increment/decrement of the counter 145 is determined by the value output by the comparator 160.

In one embodiment, when the comparator 160 output is high, the counter 145 increments, and when comparator 160 output is low, counter 145 decrements. The LPFs 130, 150 can be simple filters that can be realized using on chips resistors and capacitors. The comparator 160 can be a simple op amp or other input sensitive regenerative circuit. The divide-by-N (/N) and divide-by-K (/K) dividers 110, 120 can be basic digital dividers. The n output bits of the counter 145 select one of the $2^n$ 'delay elements' in the digital DCC. Each delay element slows or makes faster, in the time domain, an edge of the input signal to the digital DCC 140, thereby changing the duty cycle, but not the overall frequency. The output of the DCC 140 therefore will be a duty cycle corrected version of the input to the digital DCC 140.

For purposes of illustration, a very high frequency signal CLK_IN is applied in the circuit 100. That signal is input to LPF1 130. LPF1 130 then outputs onto node B, which is one input of the comparator 160, a low frequency (DC) signal that is representative of the duty cycle of CLK_IN. In one embodiment, LPF1 130 has an output voltage such that when the duty cycle is 50%, node B is at VDD/2, where VDD is the power supply voltage. When the duty cycle is 100%, then node B is at VDD and when the duty cycle is at 0%, node B is at ground. Any duty cycle between 0% and 100% can be linearly interpolated between ground and VDD.

For ease of illustration, an example is that the duty cycle of the high frequency CLK_IN signal be equal to 70%. A divided version of CLK_IN as a function of the divider 110 is input into the digital DCC 140. The input to the digital DCC 140 is labeled node A. Due to the division performed by divider 110, there is no guarantee that the duty cycle at node A is the same as that of CLK_IN. This is because most dividers operate on the rising or falling edges of clocks, and, as a result, their output will not preserve the duty cycle information of their input. For instance, even though the duty cycle of CLK_IN can vary, the duty cycle of the divider 110 is typically fixed.

The counter 145 has n bits of output, so it can count from 1 to $2^n$. For ease of illustration, the counter is initialized at $2^{n-1}$. In other words, this is the output at node F. Also the digital DCC 140 has $2^n$ different delay elements. The delay element of the DCC 140 corresponding to count $2^{n-1}$ is one that makes no duty cycle correction. For ease of illustration, delay elements above $2^{n-1}$ will push out the falling edge of signal at node A in increasing increments, to result in increased duty cycle. For ease of illustration, delay elements below $2^{n-1}$ will push in falling edge of the signal at node A in increasing increments to result in reduced duty cycle. In one embodiment, the frequency division (/N) is an even division and as a result the frequency signal at node A is output at 50% duty cycle.

The counter 145 is triggered by the signal at node E. The signal at node E is slow in frequency compared to that of node A. The comparator 160 can operate as follows. When the signal at node B is larger than that at node C, comparator 160 output at node D is high. When the signal at node B is smaller than that of node C, comparator 160 output at node D is low. The counter 150 is also controlled by node D. On a specified edge of node E, if node D is high, counter 145 increments on its previous value. On a specific edge of node E, if node D is low, counter 145 decrements on its previous value.

For example, node B is initially at a value corresponding to 70% duty cycle, while node C is at a value corresponding to 50% duty cycle. That is, CLK_OUT will initially have 50% duty cycle. Therefore, the comparator 160 output will be high. On the next rising edge of node E, the counter 160 increments its value to $2^{n-1}+1$. This will pass the signal at node A through a different delay element in the digital DCC 140. This can increment the duty cycle of CLK_OUT to 50%+δ, where δ is the duty cycle increment introduced by the digital DCC 140. CLK_OUT is then fed to LPF2 150, which will generate the corresponding low-frequency voltage on node C. The comparator 160 then compares nodes B and node C again, and this results in a new output at node D. If on the next rising edge of node E, the value of node D is still high, the counter 145 will increment its value to $2^{n-1}+2$, and the duty cycle of CLK_OUT will be 50%+2δ. This process will then continue until the duty cycle of CLK_OUT is as close as possible to the duty cycle of CLK_IN within the resolution of the digital DCC increments.

Generally, for any LPF to operate appropriately, it will need multiple cycles of an input signal to perform sufficient averaging operation. In the circuit 100, the edges of node E rise and fall at a much slower rate than those at node A, due to the divider 120 divide-by-K (/K) value. As a result, the rate at which the counter 145 increments or decrements its output value at node F is much slower than that of the signal at node A. Consequently, having divider 120 allows LPF2 150 to have sufficient time to perform the averaging.

In the circuit 100, the digital DCC 140 has discreet increments of duty cycle. In one embodiment, the duty cycle of CLK_IN is not an exact match to any one of these duty cycle values. Such offsets can also be caused by mismatches in LPF1 130 and LPF2 150, and also by offsets and dead zones associated with the comparator 160.

For example, for a given count(X) of the counter 145, CLK_OUT will have a 68% duty cycle, and at count X+1 of the counter 145, CLK_OUT will have a 72% duty cycle. Let CLK_IN have a 70% DC. In this case, the counter 145 will be banging back and forth between count X and count X+1, and consequently CLK_OUT will be moving back and forth between duty cycle of 68% and 72%, every time there is a transition at node E. This could raise an alarm in terms of introducing jitter to CLK_OUT. However, consider the following case.

For ease of illustration, CLK_IN is a signal at 5 GHz and node A (and subsequently CLK_OUT), are to be used for test purposes and are much slower, perhaps 100 MHz. For ease of illustration, the digital DCC circuit 140 increments/decrements falling edges in very coarse increments of 100 pico-seconds. Such a large increment can also include any process induced mismatches. Therefore, the error in extracting the duty cycle information of CLK_IN by looking at CLK_OUT is as follows:

$$DC = \pm(100 \text{ ps}/10000 \text{ ps}) = \pm 1/100 = \pm 1\% \qquad (1)$$

Therefore, from this crude measurement, the duty cycle of CLK-IN can be calculated within ±1% accuracy. The accuracy of the above circuit 100 then depends on the frequency of CLK_OUT, and the discrete duty cycle steps available from the digital DCC circuit 140.

In a further embodiment, the circuit 100 can be used to fix the duty cycle of CLK_OUT to any arbitrary duty cycle value.

Node B is therefore coupled to a voltage potential corresponding to a desired duty cycle value. Next CLK_IN is tied to node A, such that CLK_IN is undivided. Therefore, CLK_OUT will have the same frequency as CLK_IN. However, its duty cycle will be determined by the voltage at node B.

Figure 2:
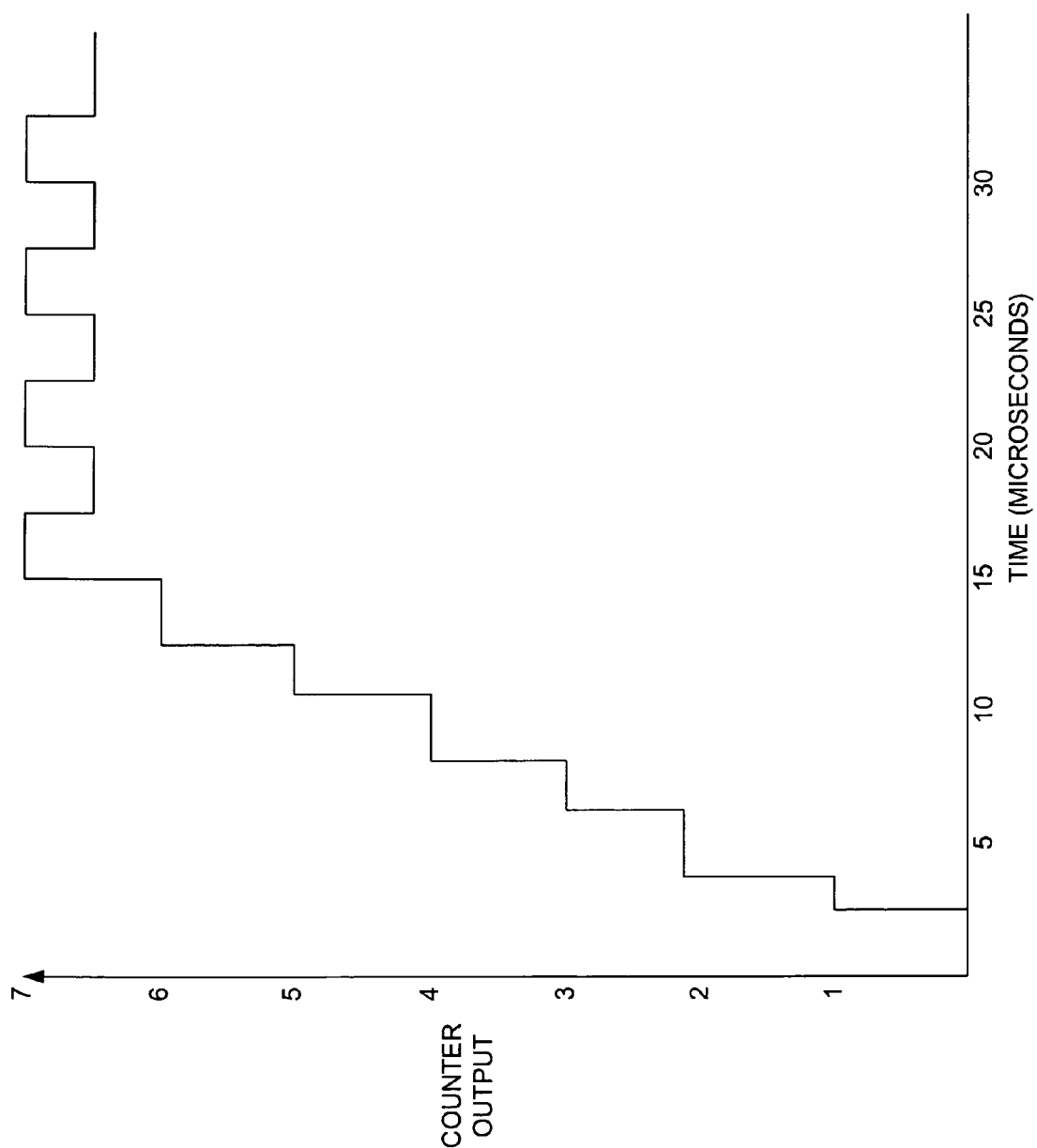
FIG. 2 illustrates the output of the counter of FIG. 1 corresponding to a percentage duty cycle for the circuit.

Turning now to FIG. 2, illustrated is a typical output from the counter 145. For FIG. 2, the counter 145 was designed such that it will count from −8 to +8 with increments of 1. The digital DCC circuit 140 generates a duty cycle of 20% at −8, and 84% at 8, with increments of 4% duty cycle per unit counter increment/decrement. Divide-by-N (/N) of the divider 110 is set to divide-by-100 (/100) while divide-by-K (/K) of the divider 120 is set to divide-by-20 (/20). The duty cycle of CLK_IN is set 78%. For illustrative purposes, the duty cycle of CLK_IN is intentionally made so that it falls outside the duty cycle values provided by the digital DCC circuit. The nearest duty cycle values available from the digital DCC 140 are 76% and 80%.

FIG. 2 shows output from the counter 145. Initially, the counter value is set at 0. This corresponds to 50% duty cycle. On every rising edge of node E of FIG. 1, the counter 145 value is incremented. Eventually the counter starts to bang back and forth between 6 and 7. 6 corresponds to duty cycle of 76%, and 7 corresponds to duty cycle of 80%.

Figure 3:
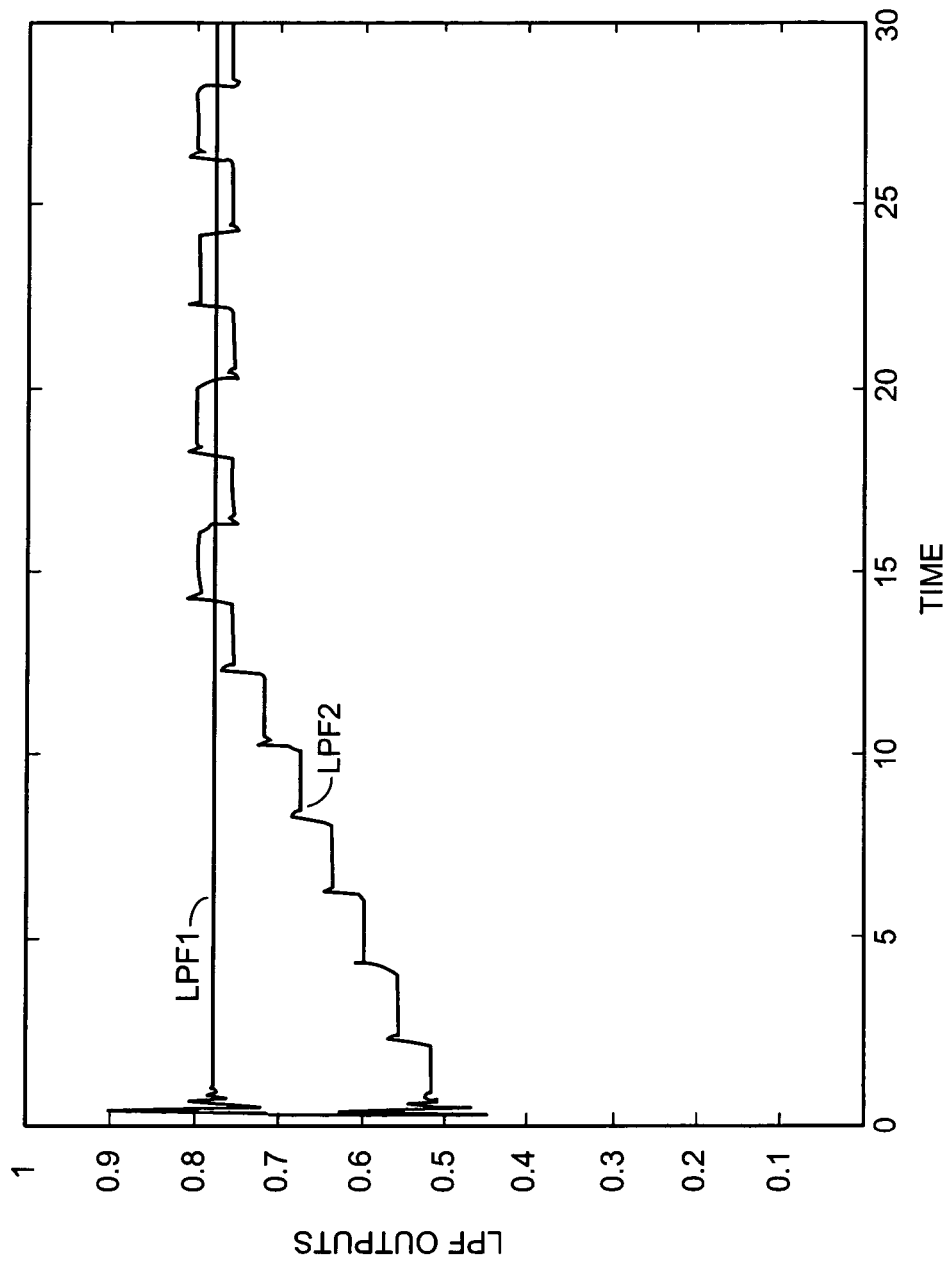
FIG. 3 illustrates the outputs of LPF1 130 and LPF2 150 in FIG. 1.

Turning now to FIG. 3, illustrated are the outputs of LPF1 130 and LPF2 150 in FIG. 1. The output of LPF1 130 corresponds to the duty cycle of CLK_IN. In the illustrated example, the steady state output of LPF2 150 oscillates above and below that of LPF1 130. This is because the duty cycle of CLK_IN (78%) lies in between the available discrete duty cycle steps of 76% and 80%.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A method for measuring and correcting duty cycle information on a clock input signal, comprising:
   receiving the clock input signal by a first LPF and by a correction circuit, wherein the step of receiving the clock input signal by the correction circuit further comprises:
      dividing the clock input signal by N;
      receiving the N-divided clock signal by a duty cycle correction circuit;
      dividing the N-divided clock signal by K;
      receiving the compared signal and the K-divided signal by a counter; and
      transmitting a counter signal to the duty cycle correction circuit;
   outputting a corrected clocking signal from the correction circuit to a second LPF;
   comparing outputs of the first LPF and the second LPF; and
   feeding a compared signal back to the correction circuit.

* * * * *